(12) United States Patent
Jalilizeinali et al.

(10) Patent No.: US 8,184,414 B2
(45) Date of Patent: May 22, 2012

(54) METHOD AND APPARATUS FOR FORMING I/O CLUSTERS IN INTEGRATED CIRCUITS

(75) Inventors: Reza Jalilizeinali, Oceanside, CA (US); Sreeker Dundigal, San Diego, CA (US); Vivek Mohan, San Diego, CA (US); Thomas R. Toms, Dripping Springs, TX (US)

(73) Assignee: QUALCOMM Incorporated, San Diego, CA (US)

( * ) Notice: Subject to any disclaimer, the term of this patent is extended or adjusted under 35 U.S.C. 154(b) by 781 days.

(21) Appl. No.: 12/182,454

(22) Filed: Jul. 30, 2008

(65) Prior Publication Data

US 2010/0027171 A1 Feb. 4, 2010

(51) Int. Cl.
*H02H 9/00* (2006.01)
(52) U.S. Cl. ......................................... 361/56
(58) Field of Classification Search ...... 361/56
See application file for complete search history.

(56) References Cited

U.S. PATENT DOCUMENTS

| | | | |
|---|---|---|---|
| 5,051,917 A | 9/1991 | Gould | |
| 5,828,110 A | 10/1998 | Wollesen | |
| 6,836,026 B1 | 12/2004 | Ali | |
| 6,849,902 B1 * | 2/2005 | Lin | 257/355 |
| 7,594,198 B2 * | 9/2009 | Chen | 716/138 |
| 7,772,887 B2 * | 8/2010 | Shankar et al. | 326/86 |
| 2001/0018757 A1 | 8/2001 | Morikawa | |
| 2002/0130332 A1 | 9/2002 | Cho | |
| 2006/0249842 A1 | 11/2006 | Isa | |
| 2007/0007545 A1 | 1/2007 | Salcedo | |
| 2007/0267748 A1 | 11/2007 | Tran | |

FOREIGN PATENT DOCUMENTS

GB 2299705 10/1996

OTHER PUBLICATIONS

International Search Report—PCT/US2009/050752, International Search Authority—European Patent Office Aug. 2, 2010.
Written Opinion—PCT/US2009/050752, International Search Authority—European Patent Office Aug. 2, 2010.
European Search Report—EP11169152—Search Authority—Munich—Aug. 31, 2011.
Partial International Search Report—PCT/US2009/050752, International Search Authority, European Patnet Office—Dec. 14, 2009.

* cited by examiner

*Primary Examiner* — Stephen W Jackson
(74) *Attorney, Agent, or Firm* — Michelle Gallardo; Nicholas J. Pauley; Jonathan T. Velasco

(57) ABSTRACT

A first I/O pad has a first type transistor disposed at a first end of the first I/O pad. A second I/O pad has another first type transistor disposed at a first end of the second I/O pad. The first end of the first I/O pad abuts the first end of the second I/O pad, so the first type transistor is adjacent to the other first type transistor.

25 Claims, 5 Drawing Sheets

METHOD AND APPARATUS FOR FORMING I/O CLUSTERS IN INTEGRATED CIRCUITS

TECHNICAL FIELD

The present disclosure relates generally to semiconductor devices. Specifically, a method and apparatus for forming I/O clusters in integrated circuits is described.

BACKGROUND

An integrated circuit conventionally interfaces with external systems using on-chip Input/Output (I/O) devices. These I/O devices are conventionally bidirectional circuits capable of driving large external loads and receiving signals for the core of the integrated circuit.

In a conventional wire bond structure, a die has one or more I/O pads placed around the edge of the die and electrical leads from the die are connected to these I/O devices. As requirements for higher pin count and lower voltage drop have grown, greater cost effectiveness and more flexible interconnect technology have become desirable.

As an alternative to the wire bond structure, flip chip interconnect technology flips the active area of a chip over to face downward. Unlike the wire bond structure, the entire surface area of the chip is available for interconnection using metal bumps over the surface of a die. The metal bumps are then soldered onto a package substrate.

Other conventional approaches included placing the metal bumps in the core to take advantage of the available die area. However, as technology scales down and die sizes reduce, placing pads in the core or the outer edges of the die makes it difficult for the die to accommodate the large number of I/O that the chip requires. As a result, the space between components decreases, increasing the risks of electrostatic damage and the formation of unwanted parasitic structures with low resistance paths, resulting in latch up. Further, because the pads are required to be spaced apart from other circuitry, both low utilization of the die area and routing congestion occurs.

Thus, what is needed is a solution for increasing pin count in a given area while reducing the risk of electrostatic discharge and latch up. The solution should permit pads to be positioned in the core as well as at the edges of the die without the limitations of conventional techniques.

SUMMARY

The present disclosure is directed to a method and apparatus that increases pin count in a given area, by clustering I/O pads with like active components positioned adjacent to each other to reduce electrostatic discharge and latch up risks, and positioning the pad clusters on inactive areas near electronic components on a die.

In one embodiment, a method for clustering I/O pads includes positioning at least two I/O pads adjacent to each other on a die. Each pad includes a first type transistor. The I/O pads have the first type transistors aligned with each other.

In another embodiment, an I/O cluster includes a first I/O pad having a first type transistor disposed at a first end of the first I/O pad and a second type transistor disposed away from the first end. A second I/O pad has another first type transistor disposed at a first end of the second I/O pad and another second type transistor disposed away from the first end. The second I/O pad is positioned adjacent to the first I/O pad so the first type transistor is closer to the other first type transistor than to the other second type transistor. The first I/O pad and the second I/O pad define a first I/O pad pair.

In still another embodiment, a method for forming an I/O cluster includes positioning a first I/O pad on a die. The first I/O pad includes a first type transistor disposed at a first end of the first pad. A second I/O pad is positioned on the die. The second I/O pad includes another first type transistor disposed at a first end of the second pad. The first end of the first I/O pad abuts the first end of the second I/O pad so the first type transistor is adjacent to the other first type transistor.

In yet another embodiment, a die apparatus includes at least one input/output (I/O) cluster. Each I/O cluster includes a first multiple of I/O pads. Each I/O pad includes a first type transistor positioned at a first end of the I/O pad and a second type transistor positioned on each I/O pad away from the first end. The first multiple of I/O pads align with each other to define a first column of I/O pads with a first arrangement of first type transistors and a first arrangement of second type transistors. A second multiple of I/O pads has each I/O pad with a first type transistor positioned at a first end of the I/O pad and a second type transistor positioned on each I/O pad away from the first end. The second multiple of I/O pads align with each other to define a second column of I/O pads with a second arrangement of first type transistors and a second arrangement of second type transistors. The first column and the second column are positioned with their respective arrangements of first type transistors adjacent to each other.

The foregoing has outlined rather broadly the features and technical advantages of the present disclosure in order that the detailed description that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

DETAILED DESCRIPTION

A detailed description of one or more embodiments is provided below along with accompanying figures that illustrate the principles of the embodiments. The scope of the embodiments is limited only by the claims and encompasses numerous alternatives, modifications and equivalents. Numerous specific details are set forth in the following description. These details are provided solely for the purposes of example and the embodiments may be practiced according to the claims without some or all of these specific details.

Figure 1:
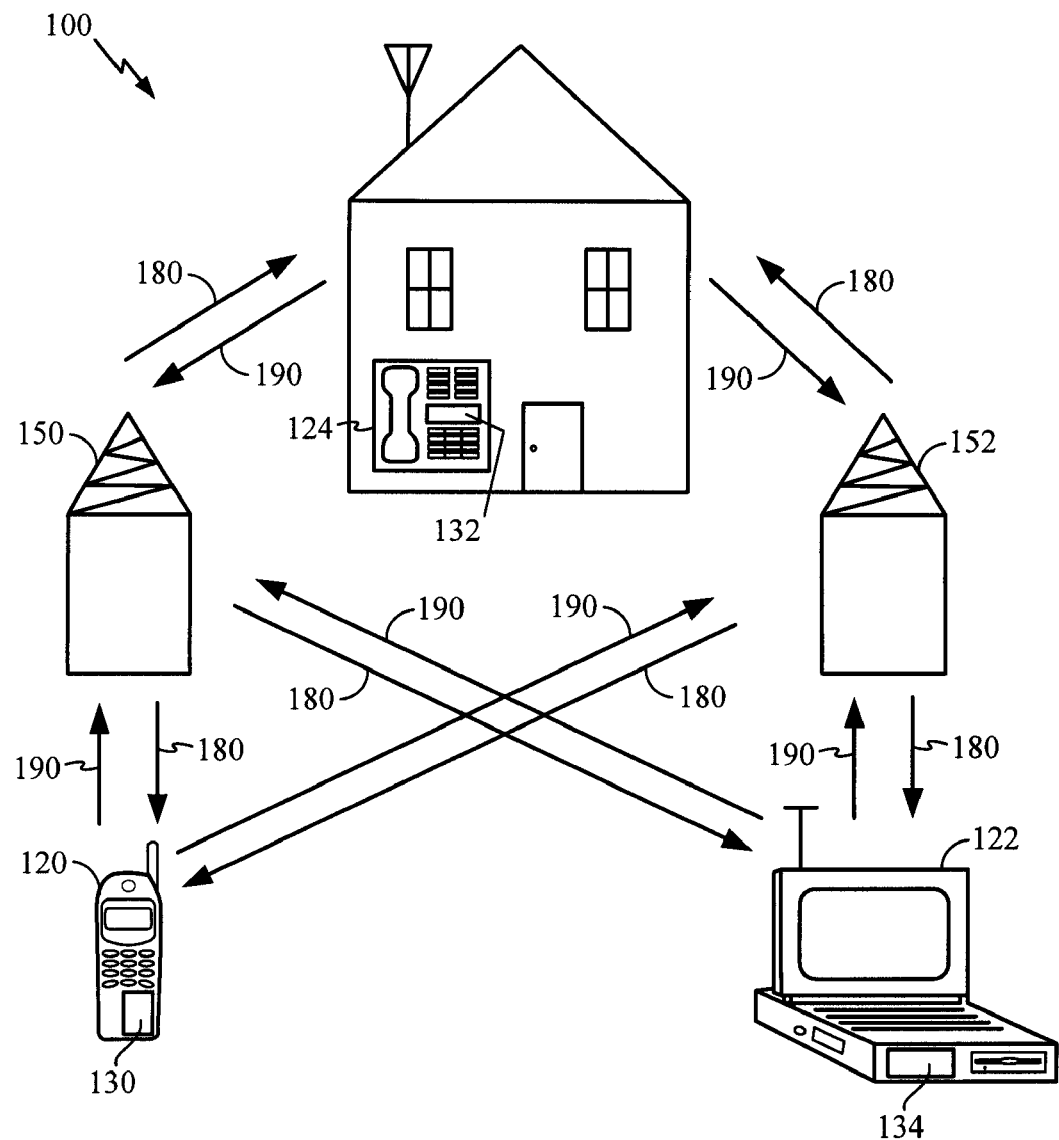
FIG. 1 is a diagram illustrating an exemplary wireless communication system.

FIG. 1 is a diagram illustrating an exemplary wireless communication system. In some embodiments, system 100 includes remote units 120-124 and base stations 150-152. It can be recognized that typical wireless communication systems may have many more remote units and base stations. The remote units 120-124 include semiconductor devices 130-134 having I/O clusters, as discussed below in more detail. FIG. 1 shows forward link signals 180 from the base stations 150-152 and the remote units 120-124 and reverse link signals 190 from the remote units 120-124 to the base stations 150-152.

In other embodiments, FIG. 1 the remote unit 120 is shown as a mobile telephone, the remote unit 122 is shown as a portable computer, and the remote unit 124 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. The disclosed device may be suitably employed in any device which includes a semiconductor device.

Figure 2:
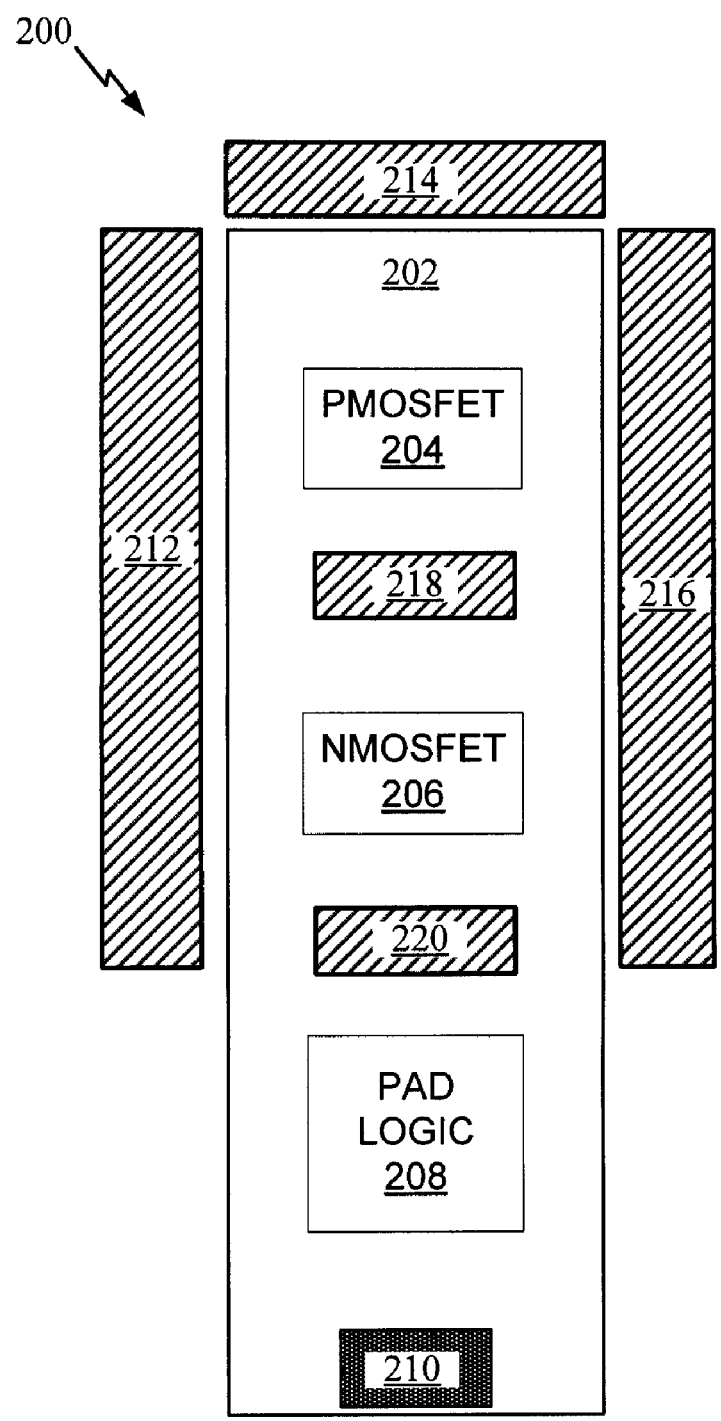
FIG. 2 is a diagram illustrating a conventional I/O pad.

FIG. 2 is a diagram illustrating a conventional I/O pad configuration. Here, an I/O pad 200 includes a pad 202, a pmos transistor 204, an nmos transistor 206, a pad logic circuit 208, and a pad contact 210. In some conventional approaches, the pad 202 uses the pmos transistor 204 and the nmos transistor 206 to drive loads externally from a chip. The pad 202 uses the pad logic circuit 208 that may include a pre-driver, a level shifter, and other logic circuitry. The pad contact 210 connects the pad 202 to the core circuitry as well as to package devices. In other conventional approaches, a space 218 is provided between the pmos transistor 204 and the nmos transistor 206 to isolate the pmos from the nmos transistors. Also, a space 220 is provided between the nmos transistor 206 and the pad logic circuit 208 to isolate the two components. Isolation is desired because the pmos transistor 204 and the nmos transistor 206 can produce unwanted parasitic devices with low resistance paths between each other causing latch up. Also, the pad 202 can be positioned next to core circuitry on a die with spacing (e.g., spaces 212-216) a guard band, a guard ring, well ties, substrate ties, or the like around the pad 202 to isolate the pad from active circuit components on the die. However, this approach becomes more difficult to use as the size of the integrated circuit is reduced and the need for more I/O pads increases.

Figure 3:
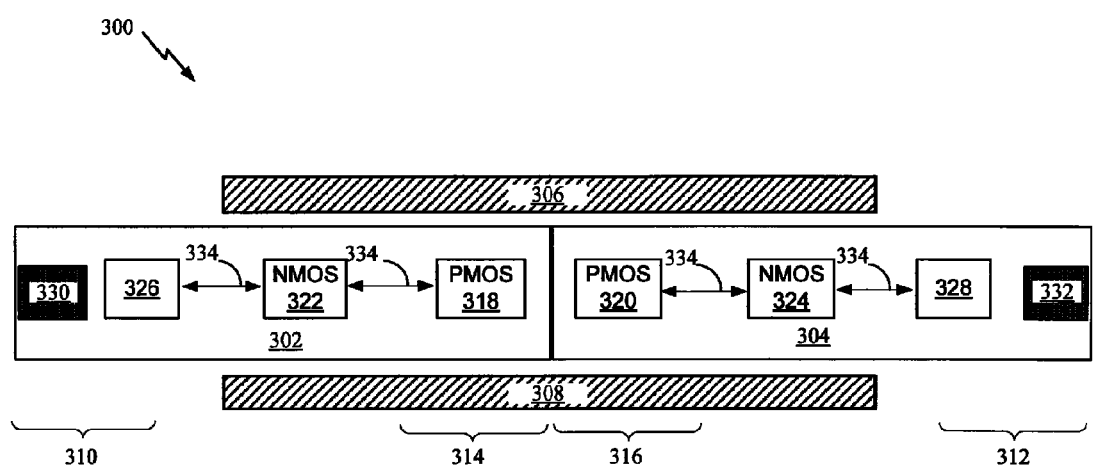
FIG. 3 is a diagram illustrating an exemplary positioning of pads to form an I/O cluster.

FIG. 3 illustrates an exemplary positioning of pads to form an I/O cluster 300 that includes pads 302 and 304; pmos transistors 318 and 320 positioned adjacent at first ends 314 and 316 respectively; nmos transistors 322 and 324 on the pads 302 and 304 but spaced from the pmos transistor 318 and 320; pad logic circuits 326 and 328; and pad contacts 330 and 332. In the illustrated embodiment, the I/O cluster 300 is made up of two closely positioned pads to form a pad pair that can be positioned on any active area of a die. Multiple I/O clusters 300 can be positioned on the die so as to be sufficiently spaced from core circuitry to prevent electrostatic damage and latchup. In the embodiment shown in FIG. 3, the pads 302 and 304 are abutted end to end with the pmos transistors of each pad 302 and 304 located immediately adjacent to each other, so that the spacing between the pads is reduced. The reduced space between pmos transistors 318 and 320 is made possible because the risk of electrostatic damage or latch up between adjacent transistors of like kind, such as two pmos or two nmos transistors, is minimal. Accordingly, having like transistors positioned adjacent to each other reduces the risk of forming unwanted parasitic structures with low resistance paths in or around the pads 302 and 304.

The pads 302 and 304, may also have nmos transistors 322 and 324. However, the nmos transistors 322 and 324 are spaced from the pmos transistors 318 and 320 a sufficient distance or gap 334 to reduce the risk of latch up. In one example, a guard ring (not shown), which can be a shielding device, is positioned within the location of gap 334 to prevent unwanted parasitic structures with low resistance paths from forming. In other examples, the gap 334 (same or different size as the gap between the transistors) can isolate the nmos transistors from the pad logic circuits as well. The pad contacts 330 and 332 are positioned at a second end 310 and 312 respectively, or can be positioned at other appropriate locations of the pads 302 and 304, so routing distances across the pads or across to other active components can be reduced. The pad logic circuits 326 and 328 are positioned near the second end 310 and 312 respectively, resulting in additional spacing between the nmos transistors 322 and 324 and the second ends, which can prevent unwanted parasitic structures with low resistance paths from forming. In one embodiment, pads 302 and 304 can be spaced from external circuitry on a die by using spaces 306 and 308, to prevent further latchup between the transistors (e.g., pmos transistors 318-320, nmos transistors 322-324) and the external circuitry. In some embodiments, the I/O cluster 300 and the above-described elements may be varied and are not limited to the functions, structures, configurations, implementations, or examples provided.

Figure 4:
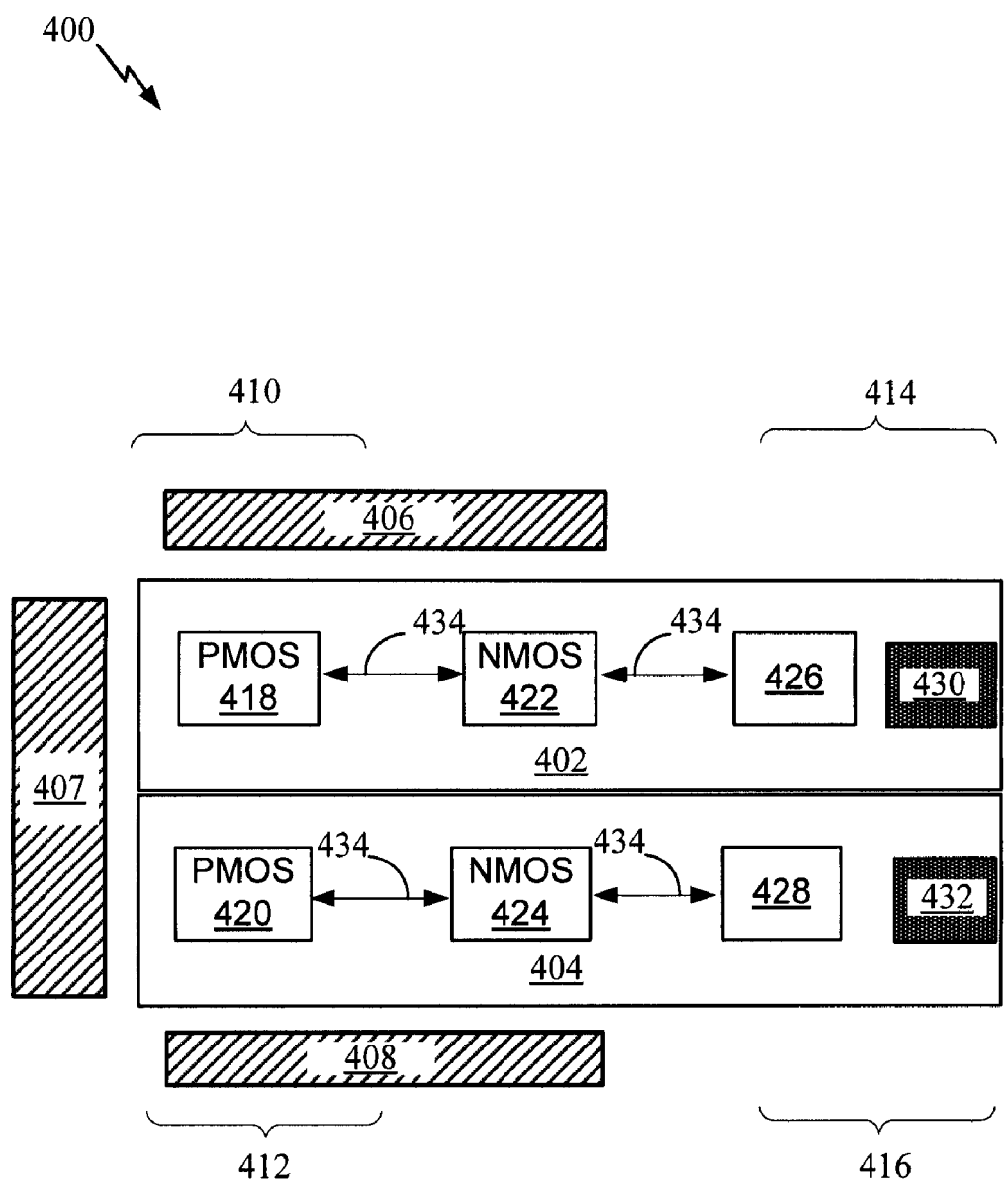
FIG. 4 is a diagram illustrating another exemplary positioning of pads to form an I/O cluster.

FIG. 4 illustrates another exemplary positioning of pads to form an I/O cluster 400 that includes pads 402 and 404, pmos transistors 418 and 420, nmos transistors 422 and 424, pad logic circuits 426 and 428, and pad contacts 430 and 432. The pads 402 and 404 in the I/O cluster 400 are abutted side by side rather than end to end as illustrated in FIG. 3 so that the pmos transistors 418 and 420 are adjacent to each other. There is no need to provide any spacing between the pmos transistors 418 and 420, because the pmos transistors are of like kind. Similarly, the nmos transistors 422 and 424 will also be adjacent to each other with no requirement for spacing between the nmos transistors 422 and 424. As previously described in connection with the embodiment of FIG. 3, the nmos transistors 422 and 424 are spaced from the pmos transistors 418 and 420 located on the first ends 410 and 412 of the pads 402 and 404 using a gap, a space, a guard ring, a guard band or other shielding device in the location of the gap 434. Having like transistors positioned adjacent to each other to reduce the risk of forming unwanted parasitic devices with low resistance paths in or around the pads enables the number of pads and hence contacts, that can be positioned within the space occupied by the I/O cluster to be increased. The pad contacts 430 and 432 are positioned on the pads 402 and 404 at second ends 414 and 416, or at other appropriate locations of the pads 402 and 404. Also, the pad logic circuits 426 and 428 are positioned near the second ends 414 and 416, which provides additional spacing to avoid forming unwanted parasitic structures with low resistance paths in or around the pads 402 and 404. In one embodiment, the pads 402 and 404 can be spaced from external circuitry on a die by using spaces 406, 407, and 408, to prevent further unwanted parasitic structures with low resistance paths from forming between the transistors (e.g., pmos transistors 418 and 420, nmos transistors 422 and 424) and the external circuitry. In one example, the I/O cluster 400 can be positioned near or on an edge of the die. In some embodiments, the I/O cluster 400 and the above-described elements may be varied and are not limited to the above disclosure.

Figure 5:
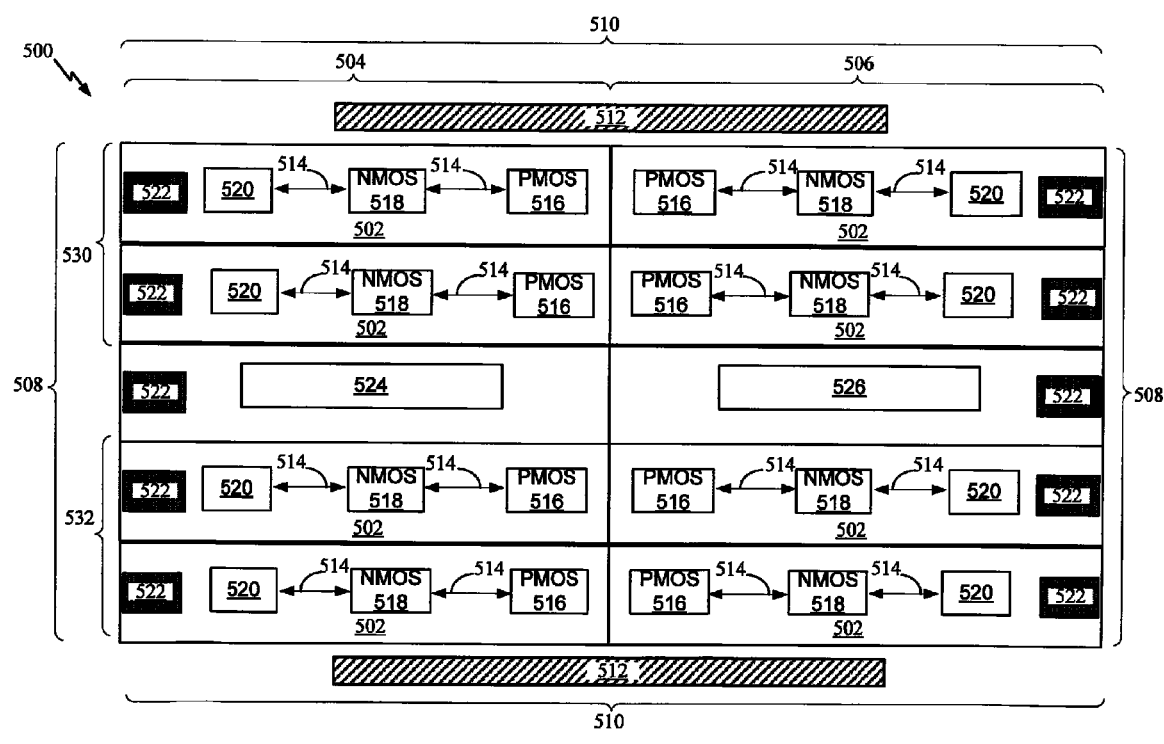
FIG. 5 is a diagram illustrating still another exemplary positioning of pads to form an I/O cluster.

FIG. 5 illustrates yet another exemplary positioning of pads to form an I/O cluster 500 that has multiple pads 502, each with a pmos transistor 516, an nmos transistor 518, and a pad contact 522. Each of the pads 502 can also include pad logic circuits 520 (similar to those shown in FIGS. 3 and 4) that provide level shifting, signal receiving, signal driving, or other I/O related functions. The I/O cluster 500 also has protection circuits 524 and 526. The pads 502 of the I/O cluster 500 are arranged with like transistors adjacent to each other so that space between pads (such as the spaces 212, 214 and 216 as shown in FIG. 2) can be eliminated and the pads abutted next to each other without space. By eliminating the spacing, the I/O cluster 500 can occupy a reduced area while still increasing the number of pads (e.g., pad 502) with contacts (e.g., pad contact 522) provided by the cluster. The specific distance between the transistors can be defined by foundry requirements or other manufacturing process requirements. Each of the pads also includes the pad contacts 522 which in the illustrated embodiment are disposed on first type edges 508 of the I/O cluster 500 so each pad contact is accessible along the first type edges 508 of the I/O cluster 500. As used herein, the phrase "first type edge" generally refers to an edge of the I/O cluster 500 that includes the pad contacts 522. The pad contact 522 of each pad is typically coupled to a solder bump (not shown), to provide an electrical path from the die circuitry through the pad to external circuitry. In various embodiments, the risk of forming unwanted parasitic structures with low resistance paths along the first type edges is minimal, because sufficient spacing exists between the nearest transistor (e.g., nmos transistor 518) and the second end (e.g., ends 310 and 312 of FIG. 3) of the pad.

The I/O cluster 500 includes multiple pads positioned adjacent to each other and aligned in a first column of pads 504 which may be a single column. Where the I/O cluster 500 is formed using multiple abutting I/O pairs as illustrated in FIG. 3, a second column 506 will be positioned adjacent to the first column 504. In this arrangement, the column 506 is oriented in such a way that the first end of each pad is abutted to the first end of each pad in the first column 504, so that unnecessary space between the pads is eliminated. Aligning the first column 504 and the second column 506 adjacent to each other results in having each pmos transistors positioned adjacent to other pmos transistors, reducing latch up between columns. Aligning the pads in each column also aligns the nmos transistors 518 with adjacent nmos transistors in other pads in the same column, so latch up will likely not occur.

The I/O cluster 500 can be located on a die in areas with low utilization. The I/O cluster 500 can be positioned on the die near other active components, such as I/O clusters or core circuitry. The I/O cluster 500 is spaced from other active components (e.g., I/O clusters, core circuitry) by leaving spaces 512 located around second type edges 510 of the I/O cluster, because less protection from latch up is provided at the second type edges 510. For example, unwanted parasitic structures with low resistance paths may form in or around the second type edges 510 and increase the risk of latchup and electrostatic damage to the transistors (e.g., pmos transistors 516, nmos transistors 518). As used herein, the phrase "second type edge" generally refers, to an edge of the I/O cluster 500 that is near both pmos and nmos transistors. In some embodiments, the spaces 512 can be defined by foundry requirements or other manufacturing process requirements that can determine electronic tolerance levels of each device used in the I/O cluster. In other embodiments, the sizing of the I/O cluster 500 can be defined by power bus resistances found inside the pads 502, and electrostatic discharge tolerance limits of each device in the pads.

The I/O cluster 500 also may include one or more protection circuits such as protection circuits 524 and 526. In one embodiment, the protection circuit 524 is shown centrally located in the column 504, so routing distances between the pads and the protection circuit are reduced. In another embodiment, the protection circuit 524 may be positioned in a different location within the I/O cluster 500. For example, the protection circuit 524 can be positioned between a first set of pads 530 and a second set of pads 532, all of which can use a common voltage. In some embodiments, the protection circuit 524 and the protection circuit 526 electrically couple to the first set of pads 530 and the second set of pads 532, respectively. In other embodiments, other pads in the I/O cluster 500 can electrically couple to either the protection circuit 524 or the protection circuit 526. The protection circuits 524 and 526 are configured to use voltage rails (e.g., pad supply, core supply, or others) according to the devices used in each pad. The protection circuits 524 and 526 are part of the circuits that protect the pads from ESD damage, which can be detrimental to operation of the I/O cluster. In other embodiments, additional protection circuits can be positioned in the I/O cluster 500 depending on the number of voltage rails present. For example, an integrated circuit can use more than one pad power supply (e.g., 3.3V, 3.6V or others) or core power supply (e.g., 1.5V, 1.8V or others). In some examples, the protection circuits 524 and 526 can be configured as voltage clamps. In some embodiments, the I/O cluster 500 and the above-described elements may be varied and are not limited to the functions, structures, configurations, implementations, or examples provided.

The present disclosure enables efficient floor planning of multiple I/O clusters on a die. The I/O clusters can be positioned on any area on the die whether in a low utilized area, or along the edges of the die or on an area with circuitry requiring close proximity. In some embodiments, the I/O clusters are positioned near high speed circuitry or other types of circuitry that need quick access, or are sensitive to noise or have some other need for close proximity. When necessary, the I/O clusters are spaced from neighboring components using the spaces 512 (shown in FIG. 5) to prevent latch up. Sometimes core circuits are placed first in the process of floor planning, followed by the I/O circuits being placed. At other times, the I/O circuits are placed first during floor planning and the core circuits are placed around the I/O circuits.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An input/output (I/O) cluster, comprising:
   a first I/O pad comprising a first type transistor disposed at a first end of the first I/O pad, and a second type transistor disposed away from the first end; and
   a second I/O pad comprising another first type transistor disposed at a first end of the second I/O pad, and another second type transistor disposed away from the first end, the second I/O pad being adjacent to and positioned side-by-side with the first I/O pad so the first type transistor is closer to the other first type transistor than to the other second type transistor and the second type transistor is closer to the other second type transistor than to the other first type transistor, the first I/O pad and the second I/O pad defining a first I/O pad pair.

2. The I/O cluster of claim 1 further comprising a protection circuit electrically coupled to the first I/O pad pair.

3. The I/O cluster of claim 1, further comprising:
   a first column of I/O pads comprising the first I/O pad pair and at least one additional I/O pad positioned side-by-side to the first I/O pad pair, and
   a second column of I/O pads comprising a plurality of I/O pads positioned side-by-side, the second column of I/O pads abutting the first column of I/O pads so the first type transistors of the first column of I/O pads are aligned with the first type transistors of the second column of I/O pads in a row.

4. The I/O duster of claim 3, wherein the second type transistors are positioned adjacent to each other in each column.

5. The I/O cluster of claim 3, further comprising a first protection circuit positioned in the I/O cluster and electrically coupled to the first column of I/O pads, the first column of I/O pads and the first protection circuit using a first common voltage.

6. The I/O cluster of claim 5, further comprising a second protection circuit positioned in the I/O cluster and electrically coupled to the second column of I/O pads, the second column of I/O pads and the second protection circuit using a second common voltage that differs from the first common voltage.

7. The I/O cluster of claim 5, in which the first protection circuit is positioned between the first I/O pad pair and the second I/O pad pair.

8. A method for clustering input/output (I/O) pads, comprising:
   positioning at least two I/O pads adjacent to each other on a die, each pad comprising a first type transistor, the I/O pads having the first type transistors aligned with each other; and
   positioning a second type transistor in each pad with each pad having the second type transistor aligning with each other, the second type transistor being spaced apart from the first type transistor.

9. The method of claim 8, further comprising:
   positioning a protection circuit adjacent to the I/O pads; and
   electrically coupling the protection circuit to the I/O pads.

10. A method for forming an input/output (I/O) cluster, comprising:
    positioning a first I/O pad on a die, the first I/O pad comprising a first type transistor disposed at a first end of the first I/O pad;
    positioning a second pad on the die, the second I/O pad comprising another first type transistor disposed at a first end of the second I/O pad, the first end of the first I/O pad abutting the first end of the second I/O pad so the first type transistor is adjacent to the other first type transistor, the first I/O pad and the second I/O pad defining a first I/O pad pair; and
    positioning a second I/O pad pair side-by-side with the first I/O pad pair so the first type transistors of the adjacent I/O pad pairs are positioned adjacent to each other.

11. The method of claim 10, further comprising positioning a first plurality of I/O pads side-by-side and adjacent to the first I/O pad of the first I/O pad pair to define a first column of I/O pads, and
    abutting the first column of I/O pads with a second column of I/O pads so the first type transistors of the first column of I/O pads are aligned next to the first type transistors of the second column of I/O pads in a row, the second column of I/O pads comprising a second plurality of I/O pads positioned side-by-side and adjacent to the second I/O pad of the first I/O pad pair.

12. The method of claim 10, further comprising:
    positioning a first protection circuit and a second protection circuit in the I/O cluster;
    electrically coupling the first I/O pad to the first protection circuit, the first protection circuit and the first I/O pad using a first voltage; and
    electrically coupling the second I/O pad to the second protection circuit, the second protection circuit and the second I/O pad using a second voltage that differs from the first voltage.

13. A die, comprising:
    at least one input/output (I/O) cluster, each I/O cluster comprising:
    a first plurality of I/O pads, each comprising a first type transistor positioned at a first end of the I/O pad and a second type transistor positioned on each I/O pad away from the first end, the first plurality of I/O pads aligned with each other to define a first column of I/O pads with a first arrangement of first type transistors and a first arrangement of second type transistors; and
    a second plurality of I/O pads, each comprising a first type transistor positioned at a first end of the I/O pad and a second type transistor positioned on each I/O pad away from the first end, the second plurality of I/O pads aligned with each other to define a second column of I/O pads with a second arrangement of first type transistors and a second arrangement of second type transistors, the first column and the second column positioned with their respective arrangements of first type transistors adjacent to each other.

14. The die of claim 13, further comprising a first protection circuit positioned in the first column and electrically coupled to the first plurality of I/O pads, the first protection circuit and the first plurality of pads use a first common voltage.

15. The die of claim 13, further comprising a second protection circuit electrically coupled to the second plurality of I/O pads, the second protection circuit and the second plurality of I/O pads use a second common voltage.

16. The die of claim 13, in which the I/O cluster is positioned at an edge region of the die.

17. The die of claim 13, further comprising a core circuit positioned adjacent to the I/O cluster on the die.

18. The die of claim 13, further comprising a core circuit in a spaced relationship to the I/O cluster on the die.

19. The die of claim 13, the I/O cluster being positioned in an orientation different from another I/O cluster on the die.

20. The die of claim 13, integrated into a device, selected from the group consisting of a set top box, music player, video player, entertainment unit, navigation device, communications device, personal digital assistant (PDA), fixed location data unit, microprocessor and a computer.

21. An input/output (I/O) cluster, comprising:
a first I/O means for a first type transistor disposed at a first end of the first I/O means, and for a second type transistor disposed away from the first end; and
a second I/O means for another first type transistor disposed at a first end of the second I/O means, and for another second type transistor disposed away from the first end, the second I/O means being adjacent to and positioned side-by-side with the first I/O means so the first type transistor is closer to the other first type transistor than to the other second type transistor and the second type transistor is closer to the other second type transistor than to the other first type transistor, the first I/O means and the second I/O means defining a first I/O means pair.

22. A die, comprising:
at least one input/output (I/O) cluster, each I/O cluster comprising:
a first plurality of I/O means for a first type transistor positioned at a first end of the I/O means and for a second type transistor positioned on each I/O means away from the first end, the first plurality of I/O means aligned with each other to define a first column of I/O means with a first arrangement of first type transistors and a first arrangement of second type transistors; and
a second plurality of I/O means for a first type transistor positioned at a first end of the I/O means and for a second type transistor positioned on each I/O means away from the first end, the second plurality of I/O means aligned with each other to define a second column of I/O means with a second arrangement of first type transistors and a second arrangement of second type transistors, the first column and the second column positioned with their respective arrangements of first type transistors adjacent to each other.

23. The I/O cluster of claim 1, integrated into a device, selected from the group consisting of a set top box, music player, video player, entertainment unit, navigation device, communications device, personal digital assistant (PDA), fixed location data unit, microprocessor and a computer.

24. The clustered I/O of claim 22, integrated into a device, selected from the group consisting of a set top box, music player, video player, entertainment unit, navigation device, communications device, personal digital assistant (PDA), fixed location data unit, microprocessor and a computer.

25. The die of claim 22, integrated into a device, selected from the group consisting of a set top box, music player, video player, entertainment unit, navigation device, communications device, personal digital assistant (PDA), fixed location data unit, microprocessor and a computer.

\* \* \* \* \*